US012602522B2

(12) United States Patent
Liu et al.

(10) Patent No.: US 12,602,522 B2

(45) Date of Patent: Apr. 14, 2026

(54) DECISION-MAKING METHOD AND SYSTEM FOR SUSPENSION OPERATION OF MARINE RISER SYSTEM BASED ON DIGITAL TWIN

(71) Applicant: China University of Petroleum, Qingdao (CN)

(72) Inventors: Xiuquan Liu, Qingdao (CN); Yanwei Li, Qingdao (CN); Pengji Hu, Qingdao (CN); Zhaowei Liu, Qingdao (CN); Na Qiu, Qingdao (CN); Xianglei Wang, Qingdao (CN); Yuanjiang Chang, Qingdao (CN); Guoming Chen, Qingdao (CN)

(73) Assignee: China University of Petroleum, Qingdao (CN)

( * ) Notice: Subject to any disclaimer, the term of this patent is extended or adjusted under 35 U.S.C. 154(b) by 972 days.

(21) Appl. No.: 17/748,386

(22) Filed: May 19, 2022

(65) Prior Publication Data

US 2023/0351071 A1      Nov. 2, 2023

(30) Foreign Application Priority Data

Apr. 27, 2022    (CN) .......................... 202210452546.5

(51) Int. Cl.
*G06F 30/20* (2020.01)

(52) U.S. Cl.
CPC .................................... *G06F 30/20* (2020.01)

(58) Field of Classification Search
CPC .. G06F 30/20; G06F 2113/14; G06F 2119/14; Y02A 90/10
See application file for complete search history.

(56) References Cited

U.S. PATENT DOCUMENTS

2015/0142315 A1* 5/2015 Guzzo ................. E21B 41/0007
                                                         702/6
2015/0346064 A1* 12/2015 Liu ......................... E21B 17/01
                                                         702/188

FOREIGN PATENT DOCUMENTS

CN      107614824 A      1/2018
CN      109118925 A      1/2019
CN      110067517 A      7/2019

OTHER PUBLICATIONS

Kharazmi E, Wang Z, Fan D, Rudy S, Sapsis T, Triantafyllou MS, Karniadakis GE. From data to assessment models, demonstrated through a digital twin of marine risers. InOffshore Technology Conference Aug. 9, 2021 (p. D031S035R003). OTC. (Year: 2021).*

(Continued)

*Primary Examiner* — Eunhee Kim

(57) ABSTRACT

Provided is a decision-making method and system for a suspension operation of a marine riser system based on a digital twin, which belongs to the technical field of marine oil and gas development. The decision-making method includes: acquiring original monitoring data by the sensor group to establish a physical entity structure model; acquiring real-time monitoring data to establish a digital twin model of the physical entity structure; and introducing navigation path and speed of the drilling platform, and a configuration and suspension mode of the riser system, combined with the digital twin model of the marine riser coupling system and a limit performance parameter, providing a suspension operation decision-making model of the riser system, and making a real-time accurate suspension operation decision based on a multi-objective optimization algorithm, so as to guarantee a safe and efficient suspension operation of the riser system.

4 Claims, 7 Drawing Sheets

(56)  References Cited

OTHER PUBLICATIONS

Yu CA, Song H, Cheng Y, Hou J. Riser integrity management plan for Lingshui 17-2 Project. InISOPE International Ocean and Polar Engineering Conference Oct. 1, 20201 (pp. ISOPE-I). ISOPE. (Year: 2020).*

Wu JH, Zhen XW, Liu G, Huang Y. Optimization design on the riser system of next generation subsea production system with the assistance of DOE and surrogate model techniques. Applied Ocean Research. Apr. 1, 2019;85:34-44. (Year: 2019).*

Liu J, Zhao H, Liu Q, He Y, Wang G, Wang C. Dynamic behavior of a deepwater hard suspension riser under emergency evacuation conditions. Ocean Engineering. Feb. 15, 2018;150:138-51. (Year: 2018).*

\* cited by examiner

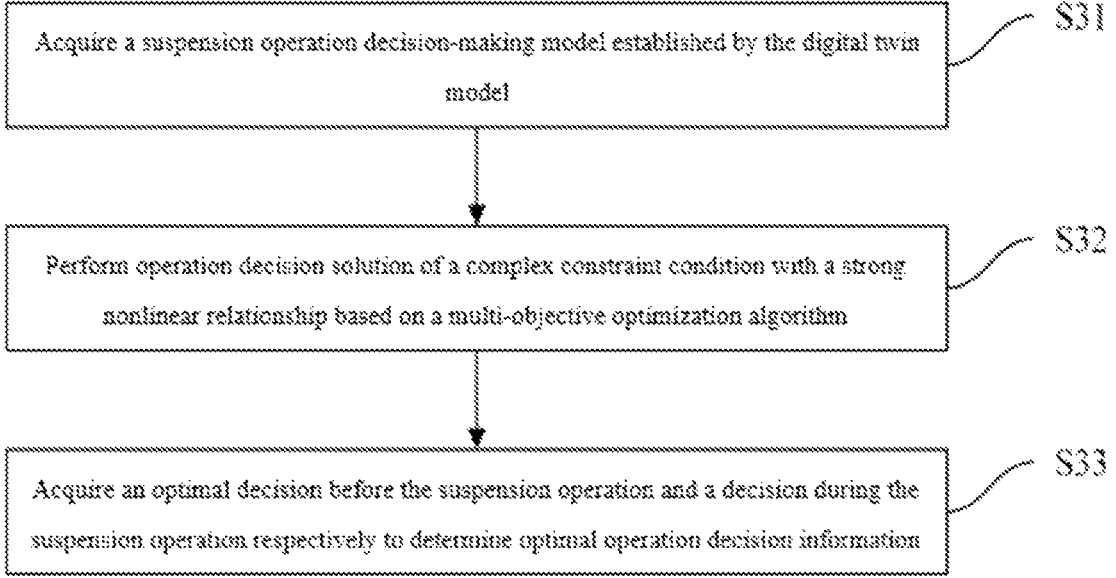

Acquire a suspension operation decision-making model established by the digital twin model — S31

Perform operation decision solution of a complex constraint condition with a strong nonlinear relationship based on a multi-objective optimization algorithm — S32

Acquire an optimal decision before the suspension operation and a decision during the suspension operation respectively to determine optimal operation decision information — S33

FIG. 4

DECISION-MAKING METHOD AND SYSTEM FOR SUSPENSION OPERATION OF MARINE RISER SYSTEM BASED ON DIGITAL TWIN

CROSS-REFERENCE TO RELATED APPLICATIONS

The application claims priority to Chinese patent application No. 2022104525465 filed on Apr. 27, 2022, the entire contents of which are incorporated herein by reference.

TECHNICAL FIELD

The present disclosure belongs to the technical field of marine oil and gas development, and in particular relates to a decision-making method and system for a suspension operation of a marine riser system based on a digital twin.

BACKGROUND

With depletion of terrestrial oil and gas resources, the oil and gas exploration and development move to the ocean, and continuously move to the deepwater with harsh environmental conditions and frequent typhoons. A marine riser is a key device for marine oil and gas exploration and development, and used for connecting a drilling platform and serving as a back-and-forth passage for mud. Before the typhoon comes, it is firstly necessary to disengage a bottom assembly of the riser from a blowout preventer, so that the riser is in a suspended and recoverable state. A traditional typhoon coping strategy is to recover all the risers disengaged, but in the face of deepwater and ultra-deepwater operations, the recovery of the risers may result in a long non-operational production time, which may seriously affect the timeliness of drilling and completion operations, and there is a problem that the riser may not be recovered. Therefore, there is a practical need for an operation mode of the drilling platform to suspend the riser for navigation. In the navigation process of the drilling platform suspending the riser, under the excitation of a drilling platform motion and the excitation of a marine environmental load, the riser produces violent vibration, and has a higher risk of suspension failure, resulting in collision with a moon pool and a fracture damage accident. There is an urgent need to provide a decision-making method for a suspension operation of a riser system, which may improve the timeliness of the suspension operation of the riser system while the safety of the suspension operation of the riser system is guaranteed. At the same time, due to randomness and uncertainty of environmental conditions, high real-time and accuracy requirements are put forward for the decision of the suspension operation. Therefore, the provided decision-making method for the suspension operation needs to have a strong adaptability to the marine environment.

SUMMARY

Embodiments of the present disclosure provide a decision-making method and system for a suspension operation of a marine riser system based on a digital twin. Its suspension operation decision-making cycle is optimized, and the timeliness and safety of the suspension operation of the riser system and the adaptability of the suspension operation decision are improved.

In view of the above problems, a technical scheme provided by the present disclosure is as follows:

In a first aspect, a decision-making method for a suspension operation of a marine riser system based on a digital twin, wherein it is applied to a physical entity structure of a marine riser coupling system composed of a marine environment system, a drilling platform and a riser system, and arranged to monitor a sensor group of the physical entity structure, and the decision-making method comprises:

S1, acquiring original monitoring data by the sensor group to establish a physical entity structure model;

S2, acquiring real-time monitoring data to establish a digital twin model of the physical entity structure; and S3, establishing a suspension operation decision-making model of the physical entity structure based on the digital twin model and determining optimal operation decision information.

As a preferred technical scheme of the present disclosure, the step S1 specifically includes:

S11, acquiring marine environment data and structural state data of the drilling platform and the physical entity structure respectively by the sensor group;

S12, processing the marine environment data and the structural state data based on a multi-source information processing technology; and S13, constructing the physical entity monitoring model in combination with the marine environment data and the structural state data.

Further, wherein the step S2 specifically comprises:

S21, acquiring the real-time monitoring data, and establishing a marine riser coupling system solution model composed of an environmental load model and a structural mechanics model based on a marine structural dynamics theory;

S22, using a frequency domain method to convert the marine riser coupling system solution model into a frequency response function model or a reverse inverse model established in a form of modal superposition;

S23, combining the frequency response function model or the reverse inverse model with the marine environment data and the structural state data to reversely obtain a flow profile of a steady-state ocean current;

S24, inputting the flow profile and the structural state data into the marine riser coupling system solution model, and acquiring dynamics simulation data of the physical entity structure;

S25, using a machine learning algorithm to train a difference value between the real-time monitoring data and the simulation data to obtain a data mapping model; and S26, integrating the environmental load model, the structural mechanics model and the data mapping model to obtain the digital twin model.

Further, wherein the step S3 specifically comprises:

S31, acquiring a suspension operation decision-making model established by the digital twin model;

S32, performing operation decision solution of a complex constraint condition with a strong nonlinear relationship based on a multi-objective optimization algorithm; and S33, acquiring an optimal decision before the suspension operation and a decision during the suspension operation respectively to determine optimal operation decision information.

Further, wherein the sensor group comprises a mechanical quantity sensor, an environmental parameter monitoring sensor and a position monitoring sensor.

Further, wherein the following steps are comprised before the step S23:

S23a, acquiring vibration attitude data of the physical entity structure; and

S23b, calculating an average number of the vibration attitude data to obtain a vibration center position of the physical entity structure.

Further, wherein the following steps are comprised after the step S23:

S23c, generating a specified motion by the drilling platform to obtain the vibration attitude data; and S23d, using a heuristic method to perform joint reverse calculation and verification on the vibration attitude data.

Further, wherein the step S31 specifically comprises:

performing a navigation path design of the drilling platform with discrete and sequentially-connected straight lines, if an initial position coordinate point of the drilling platform is $P_I(0,0)$, and a target position coordinate point is $P_T(y_T, z_T)$, then a coordinate point of an optional position $P_{i+1}$ can be represented as $P_{i+1}+1(y_{ij}, z_{ij})$;

$$\begin{cases} y_{ij} = \sum_{i=1}^{j} y_i = \sum_{i=1}^{j} s_i = \cdot \cos \theta_i \\ z_{ij} = \sum_{i=1}^{j} y_i = \sum_{i=1}^{j} s_i = \cdot \sin \theta_i \end{cases}$$

in the formula, $\theta_i$ is an included angle between a route $P_iP_{i+1}$ at the position $P_{i+1}$ and a direction y;

equally-dividing a straight line $P_IP_T$ direction into n sections, then the length of $P_iP_{i+1}$ is:

$$s_i = \frac{\frac{S}{n}}{\cos|\theta_i - \theta_{pc}|}$$

in the formula, S is a straight line distance between the initial position and the target position;

$\theta_{pc}$ is an included angle between the straight line $P_IP_T$ and the direction y, $0° \leq \theta_{pc} < 360°$, and in order to limit the motion direction of the drilling platform, setting $\theta_i$ to satisfy $-90° < \theta_i - \theta_{pc} < 90°$;

at the same time, a total navigation distance between the direction y and a direction z satisfies:

$$\begin{cases} \sum_{i=1}^{n} s_i \cdot \cos \theta_i = S \cdot \cos \theta_{pc} \\ \sum_{i=1}^{n} s_i \cdot \sin \theta_i = S \cdot \sin \theta_{pc} \end{cases}$$

it can be obtained that the navigation time $T_{sh}$ of the drilling platform navigated from the initial position to the target position is:

$$T_{sh} = \sum_{i=1}^{n} \frac{s_i}{v_i}$$

in the formula, $v_i$ is the navigation speed of the drilling platform.

Further, wherein an expression formula of the suspension operation decision-making model is:

$$\text{opt } \min[f_h(X), f_{tu}(X), f_{ve}(X)]$$
$$s.t. \begin{cases} h_{vv}(X) = 0 \; vv = 1, 2, \cdots, p \\ g_{uu}(X) \leq 0 \; uu = 1, 2, \cdots, mm \end{cases}$$

in the formula, $f_h(X)$ is the suspension operation time; $f_{tu}(X)$ is the route smoothness in the navigation stationarity of the drilling platform; $f_{ve}(X)$ is the speed smoothness in the navigation stationarity of the drilling platform; and both $h_{vv}(X)$ and $g_{uu}(X)$ are constraint conditions.

In a second aspect, an embodiment of the present disclosure further provides a decision-making system for a suspension operation of a marine riser system based on a digital twin, and the decision-making system includes:

a first establishing module, wherein the first establishing module is used to acquire original monitoring data by the sensor group to establish a physical entity structure model;

a second establishing module, wherein the second establishing module is used to acquire real-time monitoring data to establish a digital twin model of the physical entity structure; and a third establishing module, wherein the third establishing module is used to establish a suspension operation decision-making model of the physical entity structure based on the digital twin model and determine optimal operation decision information.

In a third aspect, the present disclosure provides a processing device, and the processing device includes a memory and a processor, a processing program is stored on the memory, and while the processing program is executed by the processor, the steps of the above decision-making method and the steps of the decision-making system are achieved.

In a fourth aspect, the present disclosure provides a readable storage medium, a computer program is stored on the readable storage medium, and while the computer program is executed by the processor, the steps of the above decision-making method and the steps of the decision-making system are achieved.

The beneficial effects of the above technical schemes provided by the embodiments of the present disclosure at least include:

(1) By integrating the real-time monitoring data of the physical structure of the marine riser coupling system and the dynamics simulation model of the riser system, a digital twin model of the marine riser coupling system with the characteristics of authenticity, timeliness and accuracy is formed, so as to achieve the real-time accurate prediction of the dynamic response of the riser system.

(2) The navigation path and speed of the drilling platform, and a configuration and suspension mode of the riser system are introduced; combined with the digital twin model of the marine riser coupling system and a limit performance parameter, a suspension operation decision-making model of the riser system is provided, and a real-time accurate suspension operation decision is made based on a multi-objective optimization algorithm, so as to guarantee a safe and efficient suspension operation of the riser system.

The above description is only an overview of the technical schemes of the present disclosure. In order to understand the technical means of the present disclosure more clearly, it may be implemented according to the content of the specification, and in order to make the above and other purposes, features and advantages of the present disclosure more apparent and easier to understand, the specific embodiments of the present disclosure are given below.

BRIEF DESCRIPTION OF DRAWINGS

FIG. 4 is a flow diagram of a step S3 of the decision-making method for the suspension operation of the marine riser system based on the digital twin disclosed in the present disclosure;

DETAILED DESCRIPTION OF THE EMBODIMENTS

Embodiment I

Figure 1:
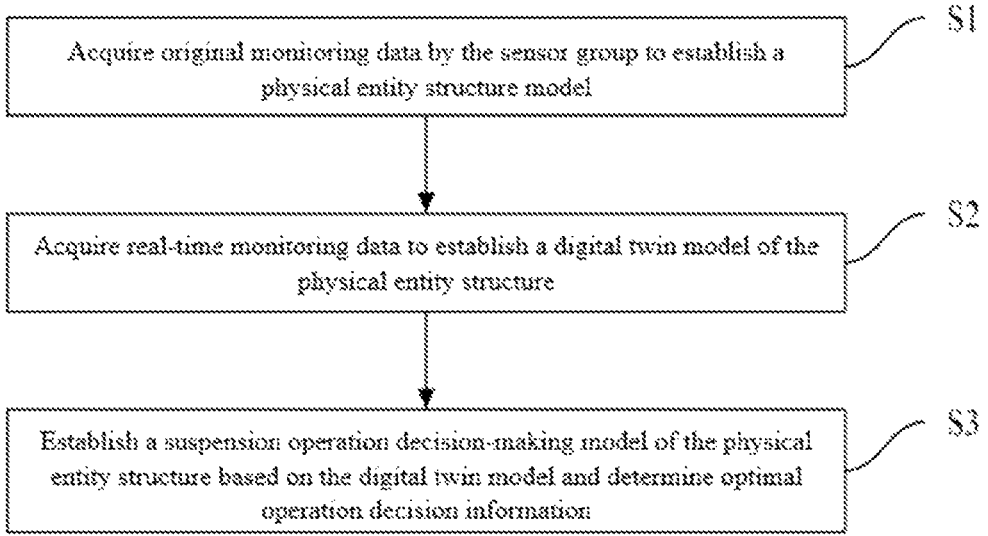
FIG. 1 is one of flow diagrams of a decision-making method for a suspension operation of a marine riser system based on a digital twin disclosed in the present disclosure.
Figure 2:
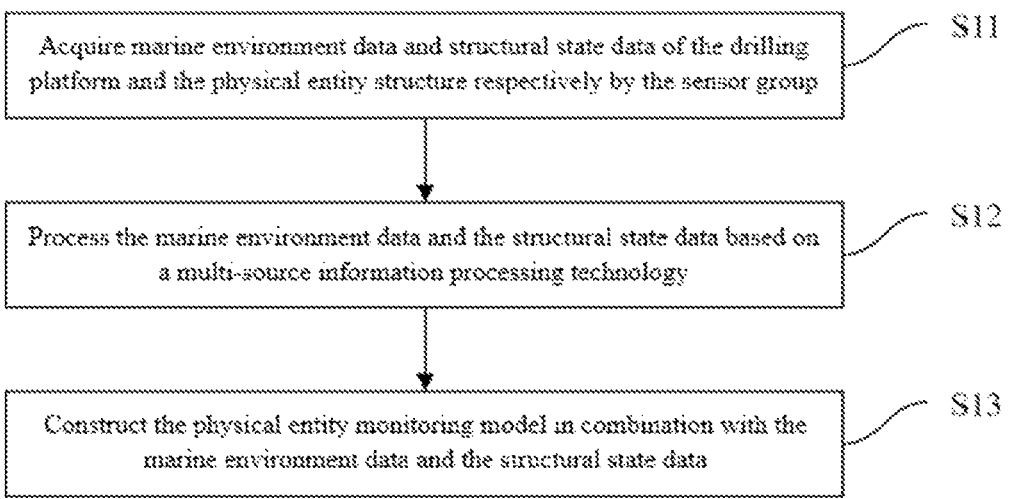
FIG. 2 is a flow diagram of a step S1 of the decision-making method for the suspension operation of the marine riser system based on the digital twin disclosed in the present disclosure.

Referring to FIGS. 1-6, the present disclosure provides a technical scheme: a decision-making method for a suspension operation of a marine riser system based on a digital twin is applied to a physical entity structure of a marine riser coupling system 2 composed of a marine environment system, a drilling platform 1 and a riser system, and arranged to monitor a sensor group of the physical entity structure. The decision-making method includes the following steps:

S1, acquiring original monitoring data by the sensor group to establish a physical entity structure model;

S2, acquiring real-time monitoring data to establish a digital twin model of the physical entity structure; and S3, establishing a suspension operation decision-making model of the physical entity structure based on the digital twin model and determining optimal operation decision information.

Specifically, the step S1 specifically includes:

S11, acquiring marine environment data and structural state data of the drilling platform and the physical entity structure respectively by the sensor group;

S12, processing the marine environment data and the structural state data based on a multi-source information processing technology; and S13, constructing the physical entity monitoring model in combination with the marine environment data and the structural state data.

Specifically, the multi-source information processing technology performs feature identification, signal identification, filter estimation, and multi-source synthesis and other processing on the marine environment data and the structural state data, so as to obtain real and effective wind-wave-current-containing data, submarine topography data, motion attitude data of the drilling platform 1, and stress-strain data and vibration attitude data of the physical entity structure, and finally the physical entity structure model may be constructed after combining the aforementioned data.

Specifically, the step S2 specifically includes:

S21, acquiring the real-time monitoring data, and establishing a marine riser coupling system solution model 2 composed of an environmental load model and a structural mechanics model based on a marine structural dynamics theory;

S22, using a frequency domain method to convert the marine riser coupling system 2 solution model into a frequency response function model or a reverse inverse model established in a form of modal superposition;

S23, combining the frequency response function model or the reverse inverse model with the marine environment data and the structural state data to reversely obtain a flow profile of a steady-state ocean current;

S24, inputting the flow profile and the structural state data into the marine riser coupling system 2 solution model, and acquiring dynamics simulation data of the physical entity structure;

S25, using a machine learning algorithm to train a difference value between the real-time monitoring data and the simulation data to obtain a data mapping model; and S26, integrating the environmental load model, the structural mechanics model and the data mapping model to obtain the digital twin model.

Specifically, the digital twin model is continuously used for state prediction, and the digital twin model is updated in combination with the monitoring data. At the same time, the parameter reverse is continuously performed in this process on the basis of the monitoring data, and thereby the authenticity, timeliness and accuracy of the digital twin data may be improved.

Specifically, the step S3 specifically includes:

acquiring a suspension operation decision-making model established by the digital twin model;

performing operation decision solution of a complex constraint condition with a strong nonlinear relationship based on a multi-objective optimization algorithm; and acquiring an optimal decision before the suspension operation and a decision during the suspension operation respectively to determine optimal operation decision information.

Specifically, the purpose of the decision before the suspension operation is to select an optimal operation mode and an optimal riser configuration, namely to preferably select a hard suspension mode, a soft suspension mode, a special suspension mode or a mode of recovery of all risers, so as to determine the number of the risers reserved while the risers are suspended; and the purpose of the decision during the suspension operation is to determine the real-time optimal navigation path and speed of the drilling platform 1.

The operation decision is continuously performed in real time according to sea conditions and early-warning information and on the basis of the updated digital twin model, and the optimal operation decision information is provided for an operator, and used for the intelligent navigation route tracking of the drilling platform 1.

In a preferred embodiment of the present disclosure, the sensor group includes a mechanical quantity sensor, an environmental parameter monitoring sensor and a position monitoring sensor.

Further, the following steps are included before the step S23:

S23*a*, acquiring vibration attitude data of the physical entity structure; and

S23*b*, calculating an average number of the vibration attitude data to obtain a vibration center position of the physical entity structure.

Further, the following steps are included after the step S23:

S23*c*, generating a specified motion by the drilling platform 1 to obtain the vibration attitude data; and S23*d*, using a heuristic method to perform joint reverse calculation and verification on the vibration attitude data.

Further, the step S31 specifically includes:

performing a navigation path design of the drilling platform 1 with discrete and sequentially-connected straight lines, if an initial position coordinate point of the drilling platform 1 is $P_I(0,0)$, and a target position coordinate point is $P_T(y_T,z_T)$, then a coordinate point of an optional position $P_{i+1}$ can be represented as $P_{i+1}+1$ $(y_{ij}, z_{ij})$;

$$\begin{cases} y_{ij} = \sum_{k=1}^{j} y_i = \sum_{k=1}^{j} s_i \cdot \cos \theta_i \\ z_{ij} = \sum_{k=1}^{j} z_i = \sum_{k=1}^{j} s_i \cdot \sin \theta_i \end{cases}$$

in the formula, $\theta_i$ is an included angle between a route $P_iP_{i+1}$ at the position $P_{i+1}$ and a direction y;

equally-dividing a straight line $P_IP_T$ direction into n sections, then the length of $P_iP_{i+1}$ is:

$$s_i = \frac{\frac{s}{n}}{\cos|\theta_i - \theta_{pc}|}$$

in the formula, S is a straight line distance between the initial position and the target position;

$\theta_{pc}$ is an included angle between the straight line $P_IP_T$ and the direction y, $0° \le \theta_{pc} < 360°$, and in order to limit the motion direction of the drilling platform, setting $\theta_i$ to satisfy $-90° < \theta_i - \theta_{pc} < 90°$;

at the same time, a total navigation distance between the direction y and a direction z satisfies:

$$\begin{cases} \sum_{i=1}^{n} s_i \cdot \cos \theta_i = S \cdot \cos \theta_{pc} \\ \sum_{i=1}^{n} s_i \cdot \sin \theta_i = S \cdot \sin \theta_{pc} \end{cases}$$

it can be obtained that the navigation time $T_{sh}$ of the drilling platform 1 navigated from the initial position to the target position is:

$$T_{sh} = \sum_{i=1}^{n} \frac{s_i}{v_i}$$

in the formula, $v_i$ is the navigation speed of the drilling platform 1.

Specifically, the navigation speed of the drilling platform 1 is determined by the physical entity structure and the limiting conditions of the drilling platform 1, and may be obtained by the digital twin model. The navigation time of the drilling platform 1 and the recovering and discharging operation time of the physical entity structure are used, to establish a suspension operation timeliness model of the physical entity structure.

The suspension operation time and the navigation stationarity of the drilling platform 1 are used as optimization objects, the navigation path, the navigation speed and the riser configuration of the drilling platform 1 are used as design variables, the digital twin model is integrated with the operating capability of the drilling platform 1, and limit performance parameters of riser physical limit and strength limit, so as to establish the constraint conditions of the design variables, and a suspension operation decision-making model of the physical entity structure is further provided.

Herein, the design variables are optimized as:

$$X = [n_r, \theta_1, \theta_2, \ldots, \theta_n, v_1, v_2, \ldots, v_n]^T$$

Further, an expression formula of the suspension operation decision-making model is:

$$\text{opt } \min[f_h(X), f_{tu}(X), f_{ve}(X)]$$

$$s.t. \begin{cases} h_{vv}(X) = 0 \, vv = 1, 2, \cdots, p \\ g_{uu}(X) \le 0 \, uu = 1, 2, \cdots, mm \end{cases}$$

In the formula, $f_h(X)$ is the suspension operation time; $f_{tu}(X)$ is the route smoothness in the navigation stationarity of the drilling platform; $f_{ve}(X)$ is the speed smoothness in the navigation stationarity of the drilling platform; and both $h_{vv}(X)$ and $g_{uu}(X)$ are the constraint conditions.

Specifically, the limit performance parameters in the constraint conditions include a riser displacement limit, a stress-strain limit, a navigation speed limit related to the performance of the drilling platform 1 itself and the environment, and a performance limit of a special structural body; and for the navigation path, the constraint conditions further include submarine topography data, and sea surface and water obstacle data, to prevent collisions with the seabed or obstacles while navigating along a designed path.

Embodiment II

Figure 3:
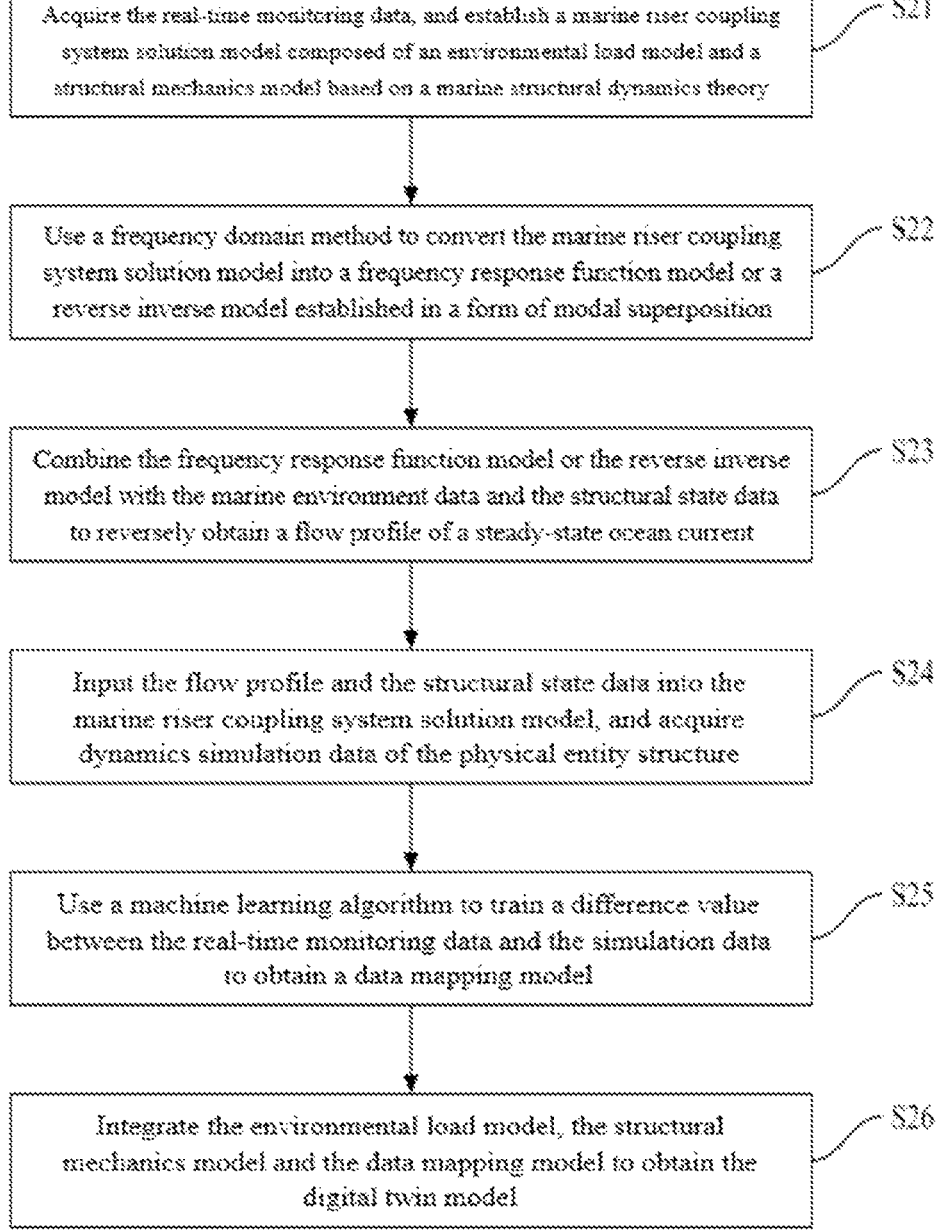
FIG. 3 is a flow diagram of a step S2 of the decision-making method for the suspension operation of the marine riser system based on the digital twin disclosed in the present disclosure.
Figure 5:
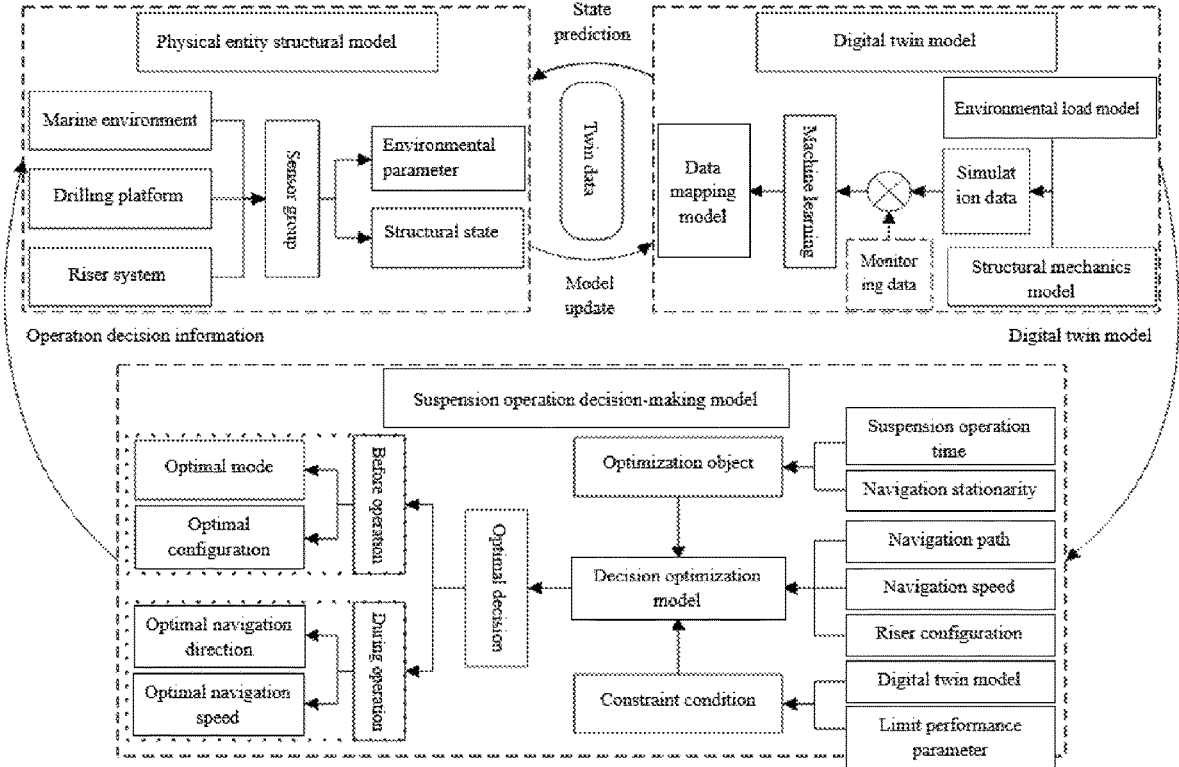
FIG. 5 is another flow diagram of the decision-making method for the suspension operation of the marine riser system based on the digital twin disclosed in the present disclosure.
Figure 6:
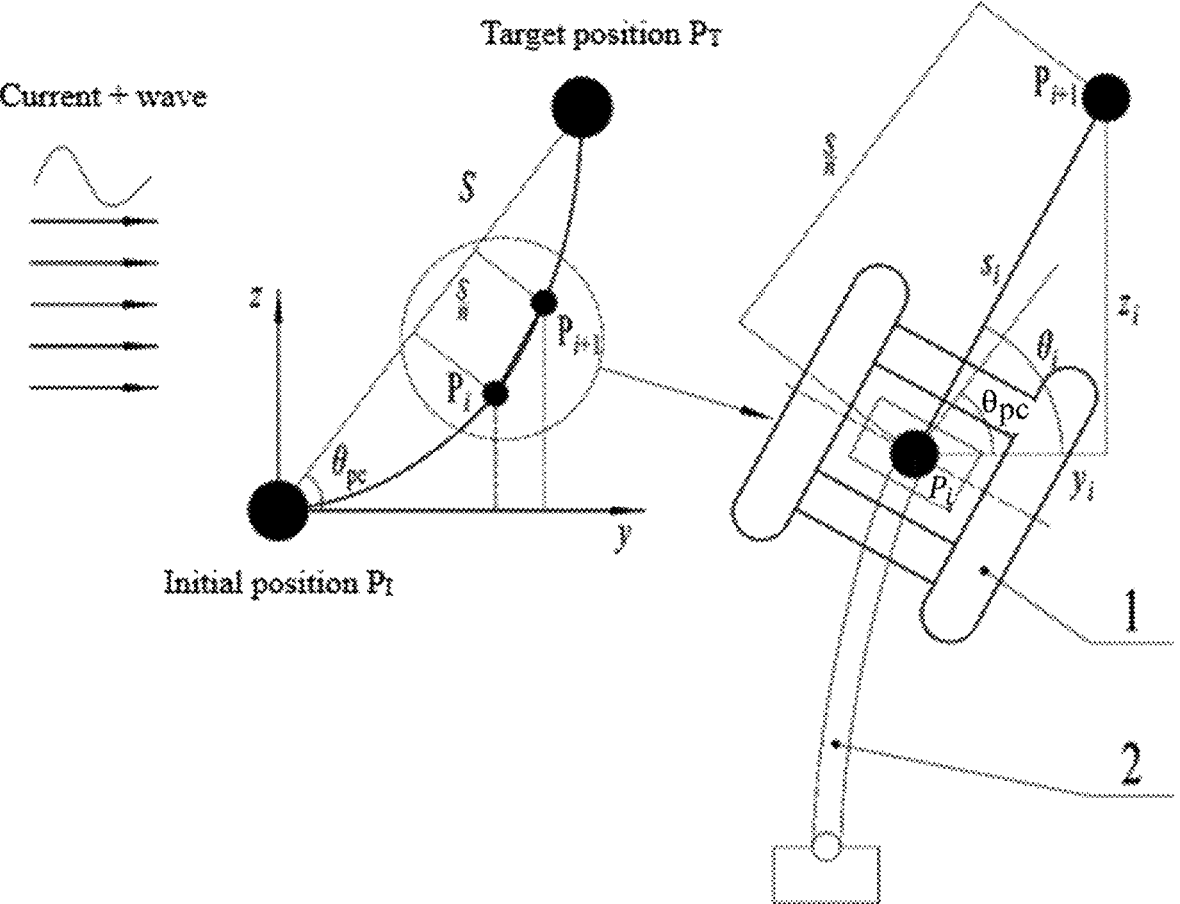
FIG. 6 is a schematic diagram of an evacuation route of a drilling platform suspending a riser system disclosed in the present disclosure.
Figure 7:
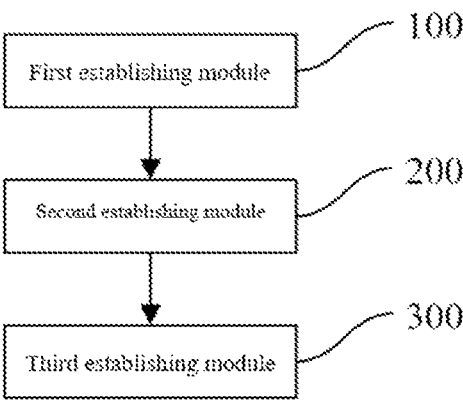
FIG. 7 is a structural schematic diagram of a decision-making system for a suspension operation of a marine riser system based on a digital twin disclosed in the present disclosure.

An embodiment of the present disclosure further discloses a decision-making system for a suspension operation of a marine riser system based on a digital twin. Referring to FIG. 3, the decision-making system includes:

a first establishing module 100, wherein the first establishing module 100 is used to acquire original monitoring data by the sensor group to establish a physical entity structure model;

a second establishing module 200, wherein the second establishing module 200 is used to acquire real-time monitoring data to establish a digital twin model of the physical entity structure; and a third establishing module 300, wherein the third establishing module 300 is used to establish a suspension operation decision-making model of the physical entity structure based on the digital twin model and determine optimal operation decision information.

Embodiment III

An embodiment of the present disclosure provides a processing device, and the processing device includes a memory and a processor, a processing program is stored on the memory, and while the processing program is executed by the processor, the steps of the above decision-making method in Embodiment I and the steps of Embodiment II are achieved.

Embodiment IV

An embodiment of the present disclosure provides a readable storage medium, a computer program is stored on the readable storage medium, and while the computer program is executed by the processor, the steps of the above decision-making method in Embodiment I and the steps of Embodiment II are achieved.

What is claimed is:

1. A method for a suspension operation of a marine riser system based on a digital twin, applied to a physical entity structure of a marine riser coupling system composed of a marine environment system, a drilling platform and a riser system, and arranged to monitor a sensor group of the physical entity structure, wherein the method comprises:

S1, acquiring original monitoring data by the sensor group to establish a physical entity structure model;

S2, acquiring real-time monitoring data from the sensor group to establish a digital twin model of the physical entity structure; and S3, establishing a suspension operation model of the physical entity structure based on the digital twin model, and determining a position of the drilling platform from the suspension operation model wherein step S1 specifically comprises:

S11, acquiring marine environment data and structural state data of the drilling platform and the physical entity structure respectively by the sensor group;

S12, processing the marine environment data and the structural state data based on a multi-source information processing technology; and S13, constructing the physical entity monitoring model in combination with the marine environment data and the structural state data; and wherein step S2 specifically comprises:

S21, acquiring the real-time monitoring data, and establishing a marine riser coupling system solution model composed of an environmental load model and a structural mechanics model based on a marine structural dynamics theory:

S22, using a frequency domain method to convert the marine riser coupling system solution model into a frequency response function model or a reverse inverse model established in a form of modal superposition;

S23, combining the frequency response function model or the reverse inverse model with the marine environment data and the structural state data to reversely obtain a flow profile of a steady-state ocean current;

S24, inputting the flow profile and the structural state data into the marine riser coupling system solution model, and acquiring dynamics simulation data of the physical entity structure;

S25, using a machine learning algorithm to train a difference value between the real-time monitoring data and the simulation data to obtain a data mapping model; and S26, integrating the environmental load model, the structural mechanics model and the data mapping model to obtain the digital twin model.

2. The method for the suspension operation of the marine riser system based on the digital twin according to claim 1, wherein the sensor group comprises a mechanical quantity sensor, an environmental parameter monitoring sensor and a position monitoring sensor.

3. The method for the suspension operation of the marine riser system based on the digital twin according to claim 1, wherein the following steps are comprised before the step S23:

S23*a*, acquiring vibration attitude data of the physical entity structure; and

S23*b*, calculating an average number of the vibration attitude data to obtain a vibration center position of the physical entity structure.

4. The method for the suspension operation of the marine riser system based on the digital twin according to claim 3, wherein the following steps are comprised after the step S23:

S23*c*, generating a specified motion by the drilling platform to obtain the vibration attitude data; and S23*d*, using a heuristic method to perform joint reverse calculation and verification on the vibration attitude data.

* * * * *